(12) United States Patent
Lee et al.

(10) Patent No.: US 7,068,559 B2
(45) Date of Patent: Jun. 27, 2006

(54) WORD LINE ENABLE TIMING DETERMINATION CIRCUIT OF A MEMORY DEVICE AND METHODS OF DETERMINING WORD LINE ENABLE TIMING IN THE MEMORY DEVICE

(75) Inventors: Hyun-Suk Lee, Seoul (KR); Kyung-Woo Nam, Seoul (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 72 days.

(21) Appl. No.: 10/950,478

(22) Filed: Sep. 28, 2004

(65) Prior Publication Data
US 2005/0083752 A1      Apr. 21, 2005

Related U.S. Application Data

(63) Continuation-in-part of application No. 10/421,739, filed on Apr. 24, 2003, now Pat. No. 6,847,572.

(30) Foreign Application Priority Data
Jul. 12, 2002    (KR)    ............................... 2002-40593

(51) Int. Cl.
*G11C 7/00*      (2006.01)

(52) U.S. Cl. ..................................... 365/222; 365/233
(58) Field of Classification Search ................ 365/222, 365/233, 233.5
See application file for complete search history.

(56) References Cited

U.S. PATENT DOCUMENTS

| 5,617,551 | A | 4/1997 | Corder |
| 6,275,437 | B1 | 8/2001 | Kim et al. |
| 6,928,020 | B1 * | 8/2005 | Takahashi et al. .......... 365/222 |

* cited by examiner

*Primary Examiner*—Vu A. Le
(74) *Attorney, Agent, or Firm*—Harness Dickey & Pierce, P.L.C.

(57) ABSTRACT

A word line enable timing determination circuit of a memory device and method of determining word line enable timing in a memory device may be configured to adjust enable timing at which to activate a word line for at least one read/write command input to the memory device. This may be based on whether the memory device is performing a hidden refresh operation. In an example, and when a read/write command is input to the memory device, a word line for the read/write command may be activated after a first delay if the memory device is not executing a hidden refresh operation. Otherwise, a word line for the read/write command is activated after a second delay.

28 Claims, 8 Drawing Sheets

WORD LINE ENABLE TIMING DETERMINATION CIRCUIT OF A MEMORY DEVICE AND METHODS OF DETERMINING WORD LINE ENABLE TIMING IN THE MEMORY DEVICE

CROSS REFERENCE RELATED APPLICATIONS

This U.S. nonprovisional patent application is a continuation-in-part of, and claims priority under 35 U.S.C. §120, to U.S. patent application Ser. No. 10/421,739 by Hyun-Suk Lee et al., filed Apr. 24, 2003 now U.S. Pat. No. 6,847,572 and entitled "Refresh Control Circuit and Methods of Operation and Control of the Refresh Control Circuit", the entire contents of which is hereby incorporated by reference.

BACKGROUND OF THE INVENTION

1. Field of the invention

The present invention relates to a word line enable timing determination circuit of a memory device and methods of operation therefor.

2. Description of the Related Art

A pseudo static random access memory (PSRAM) internally uses a cell structure of a dynamic random access memory (DRAM), and is externally similar to a static random access memory (SRAM). A cell structure of a PSRAM includes a unit transistor and a unit capacitor, like the DRAM, and is thus termed a unit transistor random access memory (UtRAM). In these memory structures, a refresh operation is typically needed to prevent a loss of data stored in memory cells. The PSRAM includes an internal refresh oscillator to perform a refresh operation at a constant period, and may automatically perform a hidden refresh by using a refresh control pulse generated in the refresh oscillator.

When a read/write command is externally input to the PSRAM to perform a read/write operation, while a memory cell is being refreshed with the internal refresh oscillator, data of the memory cell cannot be guaranteed to execute the read/write operation. That is why a controller at the exterior of the PSRAM cannot acknowledge when a refresh operation within a memory chip is to be performed.

FIG. 1A is a timing diagram of a fixed dummy duration for a hidden refresh operation in a prior art memory device. To solve the above-described problem in a prior art memory device such as a PSRAM, a fixed dummy duration, during which the hidden refresh operation may be performed, is unconditionally guaranteed before an external read/write command is executed in a given read/write cycle. In other words, whenever a read or write command is to be executed, the fixed dummy duration is needed to guarantee the row cycle time, or 'trc' for hidden referesh of a word line. Thus, in the prior art PSRAM, the word line enable time for a read/write command is always delayed by the fixed dummy duration time. This may pose a substantial restriction or limit on the high-speed operational capabilities of a memory device such as a PSRAM.

In FIG. 1A, "addr" indicates an address, "WL" represents a word line, and "DQ" represents output of data. The time "tRC" represents a read cycle time, "tAA" represents an address access time, and "taa" represents a duration of time from a time enabled to a word line until an output time of data.

FIG. 1B illustrates a trc (row cycle time) for a word line of the hidden refresh in further detail. In the prior art, the dummy duration time is needed to guarantee trc for a word line of hidden refresh in a memory device such as a PSRAM. The trc (row cycle time) may be further comprised of a row active time (tRAS) and a row precharge time (tRP). As shown in FIGS. 1A and 1B, the fixed dummy duration is about equal to the trc, so as to guarantee a sufficient trc duration for a word line of hidden refresh.

FIG. 2 illustrates a circuit diagram of a prior art word line enable determination circuit in a memory device such as a PSRAM chip. Referring to FIG. 2, a word line enable determination circuit 200 includes an address transition detector (ATD) 210 for sensing a transition of an address signal addr inputted from an exterior of the PSRAM chip, and for generating an address detection pulse (PP). Circuit 200 may also include an address decoder (not shown) for decoding the address signal address so as to activate the word line. A dummy duration part 212 may delay, by a given delay time, the PP so as to output a delayed detection pulse (PUL). An automatic pulse generator (hereinafter, referred to as a 'pulse generator') 214 may automatically generate a delayed dummy control pulse signal (PULP) when the PUL is disabled, i.e., if the PUL goes to a low state.

Word line enable determination circuit 200 may also include a refresh cutting signal generator 216 for outputting a refresh cutting signal (NERFH) based on the received PUL. A refresh pulse signal generator 220 may generate a refresh pulse signal (SRFHP) in response to a hidden refresh signal (SRFH) that is output with a given period from an internal refresh oscillator 218. The refresh pulse signal generator 220 may cut off an output of the SRFHP in response to the NERFH. A word line enable circuit 222 may generate a word line enable duration signal (PWL) during a given time, in response to the PULP and the SRFHP, as shown in FIG. 2. The PWL and a decoded address signal (addr) may be input to a row decoder (not shown) so as to activate a word line (WL) for a read/write command. Namely, the word line is enabled during a high pulse width of the PWL, hence the PWL may be referred to as the word line enable duration signal.

The SRFH output from the internal refresh oscillator 218 may be provided to a refresh address counter (not shown), so as to perform a refresh operation of the memory cell. The dummy duration part 212 may include inverters 223 through 226 (connected in series) NOR gate 228 and inverter 229, for generating the PUL at a first pulse width, by performing a negative logical sum of the PP, which is supplied to an input terminal of inverter 223 and to NOR gate 228, as shown in FIG. 2.

The pulse generator 214 may be embodied as an automatic pulse generator that includes an inverter 232 and a NOR gate 234. The refresh cutting signal generator 216 may include inverters 236, 238 and 242 and NOR gate 240. The refresh cutting signal generator 216 outputs the NERPH in response to the received PUL, as discussed above.

The refresh pulse signal generator 220 may be embodied as a an automatic pulse generator including an inverter 244, NOR gate 246 and RS flip-flop 248. RS flip-flop 248 may be set by an output of the NOR gate 246 and reset by the NERFH. Refresh pulse signal generator 220 further includes inverter 250 for inverting an output of the RS flip-flop 248 to output the refresh pulse signal SRFHP.

The word line enable duration circuit 222 may include a NOR gate 252 for performing a negative logical sum of the PULP and the SRFHP, inverters 254, 256, 258 and 262, and a NOR gate 260. The word line enable duration circuit 222 thus generates the PWL based on the PULP and the SRFHP.

Operations of the word line enable determination circuit in the general PSRAM of FIG. 2 may be described referring to the timing diagrams of FIGS. 3 through 5. When the read/write address signal addr is input to ATD 210 and the PP is output therefrom, a duration of the PP may be extended by inverters 224, 226 and NOR gate 228 within the dummy duration determination part 212 of FIG. 2, to be output as the delayed detection pulse PUL. At this time, delay through inverters 224, 226 and the NOR gate 228 may represent a fixed dummy duration time, as shown in the PUL of FIG. 3. When the PUL is delayed by the pulse generator 214 and is generated as the delayed pulse PULP, a word line enable duration signal may be activated by the word line enable detection circuit 222, shown as PWL in FIG. 3. Thus, the timing diagram of FIG. 3 illustrates that in the prior art, word line enable timing is delayed by a fixed dummy duration time, which in FIG. 3 equals the pulse width of the PUL.

When the hidden refresh signal SRFH of a 'low' state is generated from the internal refresh oscillator 218, such that the fixed dummy duration is determined every read/write cycle, the RS flip-flop 248 is set, enabling word line enable duration circuit 222. At this time, memory cells within a memory cell array are refreshed by a refresh address counter operation, upon receipt of the SRFH. The RS flip-flop 248 is reset by the NERFH output from the refresh cutting signal generator 216. Thus, in a case where the prior art word line enable determination circuit 200 of FIG. 2 executes a refresh operation at a minimum tRC, the circuit 200 operates as illustrated by the timing diagram of FIG. 4. In FIG. 4, a tRC(read cycle time) is essentially equal to a tAA(address access time) in the prior art SRAM, therefore the tRC based on the circuit of FIG. 2 may be determined as 2trc (tRC=2trc).

A skew free operation is a function supported in an PSRAM. A skew free operation may be understood as an operation of ignoring a precedent arriving read/write command when two or more read/write commands are successively received by the PSRAM, in a time period in which a minimum tRC is smaller than a fixed dummy duration, such as is shown in FIG. 5. When consecutive read/write commands are received internally in the PSRAM, within a time period that is smaller than a trc duration, the preceding (i.e., first) read/write commands are ignored and not performed, so as to sufficiently guarantee the trc duration.

SUMMARY OF THE INVENTION

An exemplary embodiment of the present invention is directed to a word line enable timing determination circuit in a memory device adapted to perform a hidden refresh operation. The word line enable timing determination circuit may include a detector detecting an address signal and generating a detection pulse in response to the detected address signal. A first signal generator in the word line enable timing determination circuit may generate a delayed detection pulse having a first pulse width, and a second signal generator may generate a pulse signal based on the state of the delayed detection pulse. A third signal generator may generate a refresh cutting signal in response to a delayed version of at least one of the delayed detection pulse and the pulse signal, and a fourth signal generator may generate a refresh pulse in response to an output from an internal refresh oscillator, and may cut off the refresh pulse in response to the refresh cutting signal. The word line enable timing determination circuit may further include a first circuit generating a word line duration signal in response to the pulse signal and the refresh pulse, and a second circuit for extending the first pulse width of the delayed detection pulse to a second pulse width in response to the world line duration signal.

Another exemplary embodiment of the present invention is directed to a method of determining word line enable timing in a memory device adapted to perform a hidden refresh operation. In the method, and when a read/write command is input to the memory device, a word line for the read/write command may be activated after a first delay if the memory device is not executing a hidden refresh operation. Otherwise, a word line for the read/write command is activated after a second delay.

Another exemplary embodiment of the present invention is directed to a method of determining word line enable timing in a memory device. In the method, and when consecutive first and second read/write commands are input to the memory device, if the second read/write command is received by the memory device within a first time after receiving a first read/write command, the first read/write command is ignored and the word line for the second read/write command is activated after the first time. Otherwise, if the second read/write command is received within a time duration that is greater than the first time but less than a duration of a row cycle time (trc) after receiving the first read/write command, a word line for the first read/write command is activated, and a word line for the second read/write command is activated after a second time has elapsed.

Another exemplary embodiment of the present invention is directed to a method of determining word line enable timing in a memory device. This example is applicable when consecutive first, second and third read/write commands are input to the memory device. In the method, if the second read/write command is received by the memory device within a time duration that is greater than a first time but less than a duration of a row cycle time (trc) after receiving the first read/write command, and the third read/write command is received after receiving the second read/write command in a time duration that is less than or equal to the first time, then the following occur. A word line for the first read/write command is activated, the second read/write command is ignored, and a word line for the third read/write command is activated.

Another exemplary embodiment of the present invention is directed to a method of determining word line enable timing in a memory device. In the method, enable timing at which to activate a word line for a memory cell of the memory device, in response to at least one read/write command input to the memory device, may be adjusted. This may be based on whether the device is performing a hidden refresh operation.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the exemplary embodiments of the present invention.

DETAILED DESCRIPTION OF THE EXEMPLARY EMBODIMENTS

Hereinafter, exemplary embodiments of the present invention will be described in detail with reference to FIGS. 6 to 11B. The elements described in FIGS. 6–11B in accordance with the exemplary embodiments of the present invention are similar to those described with respect to the PSRAM device of FIGS. 1 through 5, and therefore a detailed description thereof will be generally limited to the differences for the sake of brevity.

Figure 6:
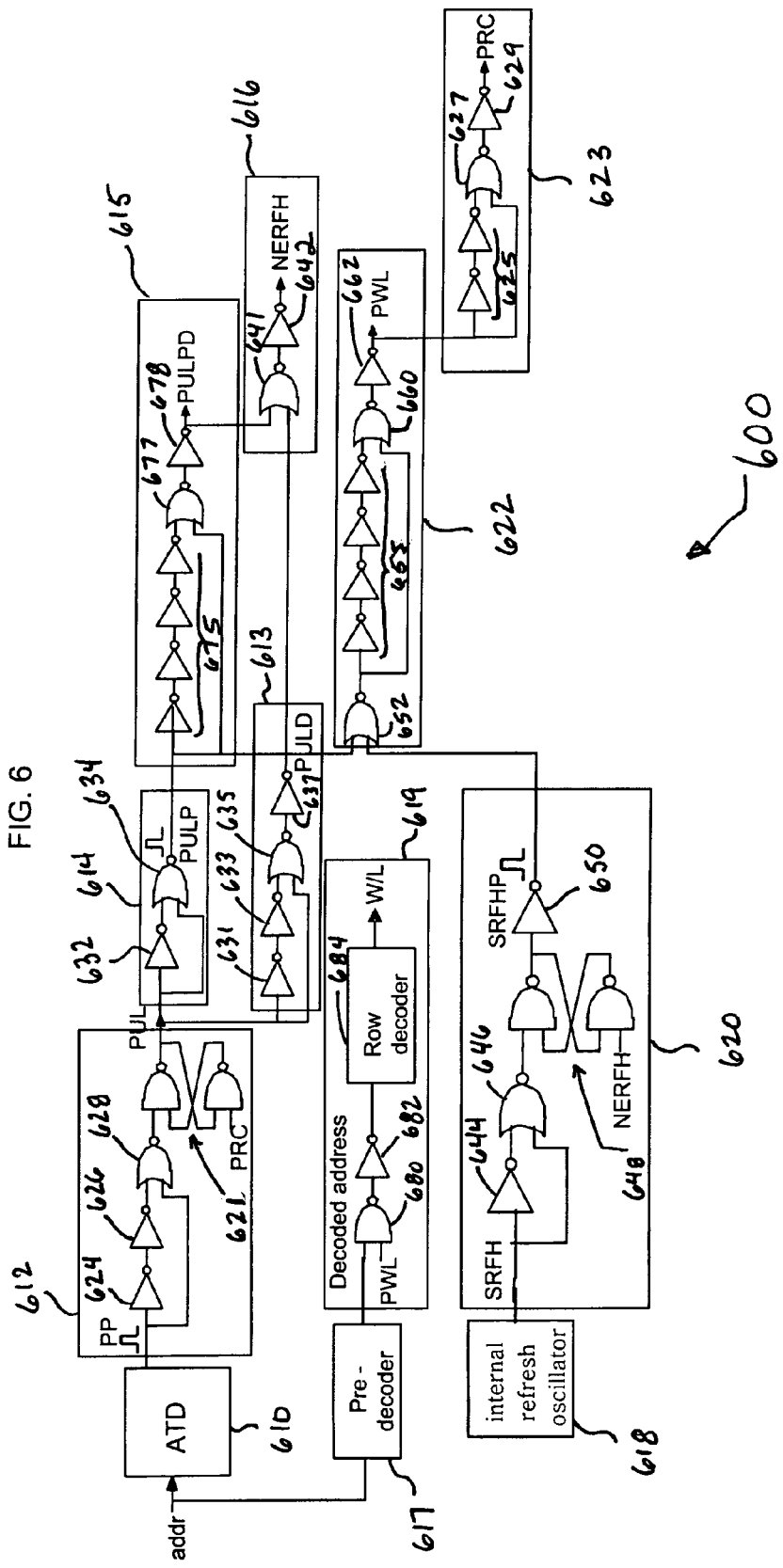
FIG. 6 is a circuit diagram of a word line enable timing determination circuit in a memory device adapated to perform a hidden refresh operation, in accordance with an exemplary embodiment of the present invention.

FIG. 6 is a circuit diagram of a word line enable timing determination circuit in a memory device such as a PSRAM in accordance with an exemplary embodiment of the present invention. In word line enabling timing determination circuit 600, a dummy duration part 612 may further include an RS flip-flop 621 connected between a NOR gate 628 of the dummy duration part 612, and an inverter 632 of a pulse generator 614, as shown in FIG. 6. As discussed above, the dummy duration part 612 generates the delayed detection pulse (PUL) so as to have a first pulse width. The first pulse width may be represented by the dummy duration time, and may occasionally be referred to hereafter as a first time or a first delay. Additionally, there is provided a first delay circuit 613 to delay the delayed detection pulse (PUL) so as to generate a first delayed detection pulse (PULD). First delay circuit 613 may include inverters 631 and 633 which receive the PUL and a NOR gate 635 which cooperates with an inverter 637 at the output thereof to generate the PULD. In addition to a pulse generator 614 for generating the pulse signal (PULP) when the delayed detection pulse (PUL) disables, (i.e., goes low), the word line enable timing determination detection circuit 600 also includes a second delay circuit 615. The second delayed circuit 615 receives the PULP as an input to inverter chain 675, which cooperates with a NOR gate 677 and an output inverter 678 to generate a delay pulse signal (PULPD). The outputs of the first and second delay circuits 613 and 615 (PULD and PULPD) serve as inputs to NOR gate 641 of a refresh cutting signal generator 616. In response to these inputs, the refresh cutting signal generator 616 generates the refresh cutting signal NERFH.

Figure 1A:
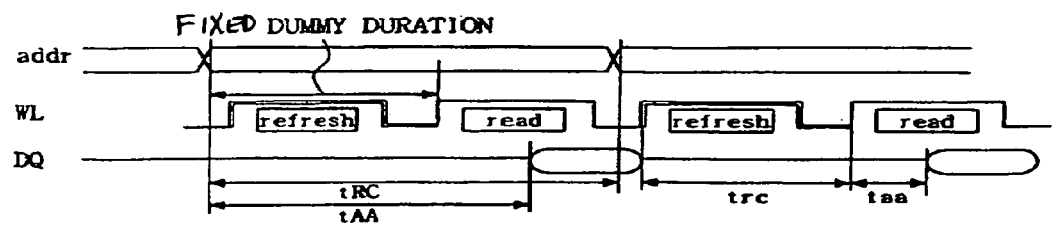
FIG. 1A is a timing diagram of a fixed dummy duration for a hidden refresh operation in a prior art memory device.
Figure 1B:
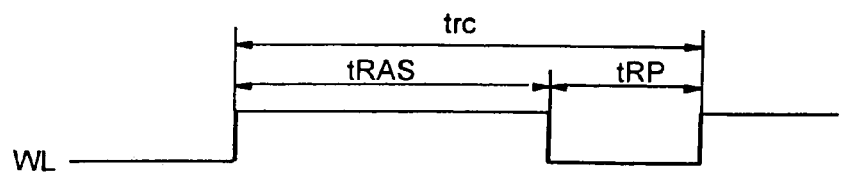
FIG. 1B illustrates a trc for a word line of the hidden refresh in further detail.
Figure 3:
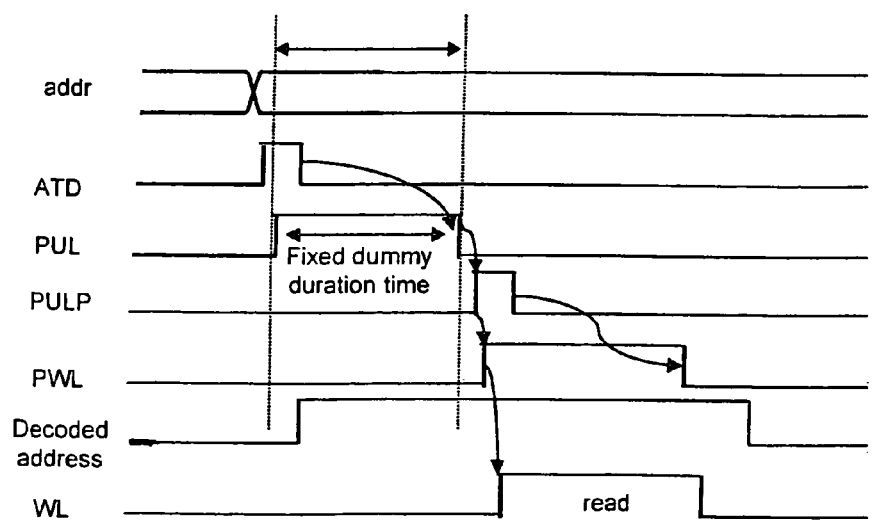
FIG. 3 is a timing diagram illustrating the generation of the fixed dummy duration time at a minimum read cycle time, according to the circuit of FIG. 2.
Figure 2:
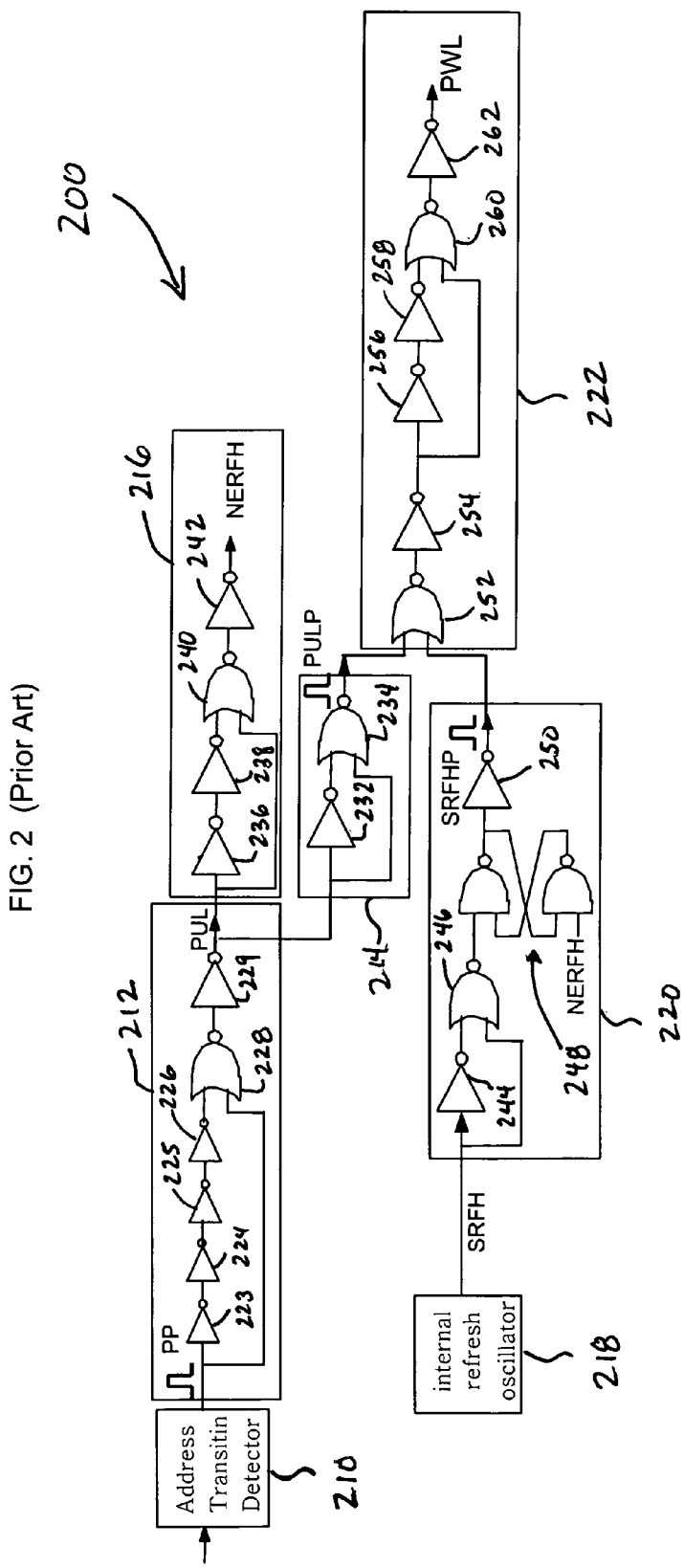
FIG. 2 is a circuit diagram of a word line enable determination circuit in the prior art PSRAM.
Figure 4:
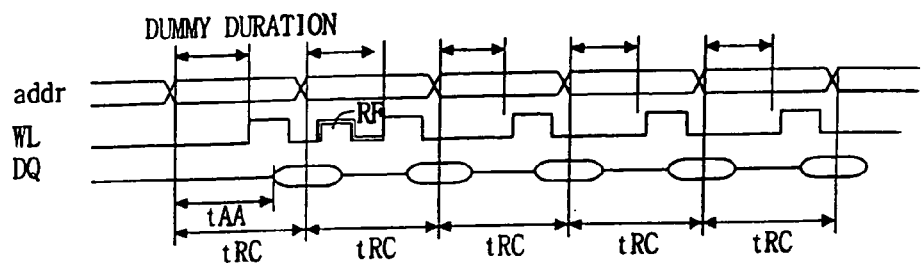
FIG. 4 is a refresh timing diagram at a minimum read cycle time according to the circuit of FIG. 2.
Figure 5:
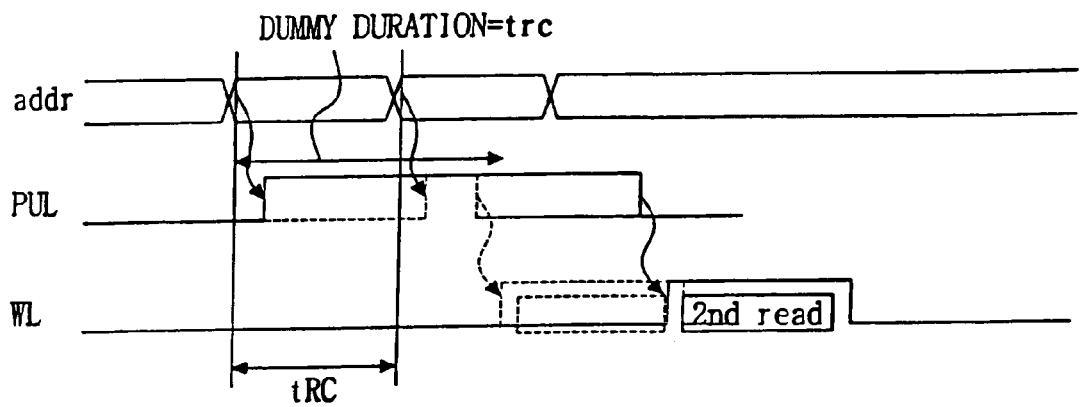
FIG. 5 is a timing diagram showing a skew free state according to the circuit of FIG. 2.

A refresh pulse signal control part 620 is similar to that shown in FIG. 2 and generates a refresh pulse signal (SRFHP) in response to the internal refresh oscillator 615. Based on the NERFH input to the RS flip flop 648, the refresh pulse signal control part 620 may cut off the SRFHP. Additionally as shown in FIG. 6, the address signal addr may also be an input to a pre-decoder 617 for decoding the address signal. The decoded address signal is input to a row decoder 619 so as to activate a word line responsive to the decoded address and a word line enable duration signal (PWL) that is generated in a word line enable duration circuit 622.

As previously discussed, the SRFHP (input from refresh pulse signal control part 620) and the PULP from pulse generator 614 may be used to generate the word line enable duration signal (PWL). An output node of inverter 662 in the word line enable duration circuit 622 may be further connected to a word line enable period guarantee circuit 623 so as to input PWL thereto. The word line enable period guarantee circuit 623 may include an inverter chain 625, a NOR gate 627 for performing a negative logical sum of an output of the inverter chain 625 and an output of the inverter 662, and an inverter 629 for inverting an output of the NOR gate 627 to output a dummy duration guarantee pulse PRC. Moreover, the word line enable period guarantee circuit 623 is designed to extend the first pulse width of the PUL, responsive to the PWL input thereto. This may be done by providing the dummy duration guarantee pulse (PRC) as an input to the RS flip flop 621 in the dummy duration part 612. Accordingly, the PRC generated in the word line enable period guarantee 623 may be adapted to extend the first pulse width of the delay detection pulse (PUL). The extended first pulse width may occasionally be referred to as one or more of a second pulse width, a second delay and/or a second time, and reflects an extended dummy duration time. As will be seen in further detail below, whether or not the word line is enabled after the dummy duration time, or after an extended dummy duration time, is a function of whether or not the memory device is in a hidden refresh mode.

Operations of the word line enable timing determination circuit 600 may be described as follows, with reference to timing diagrams in FIGS. 7 to 11B. These figures should be observed with occasional reference to FIG. 6.

Figure 7:
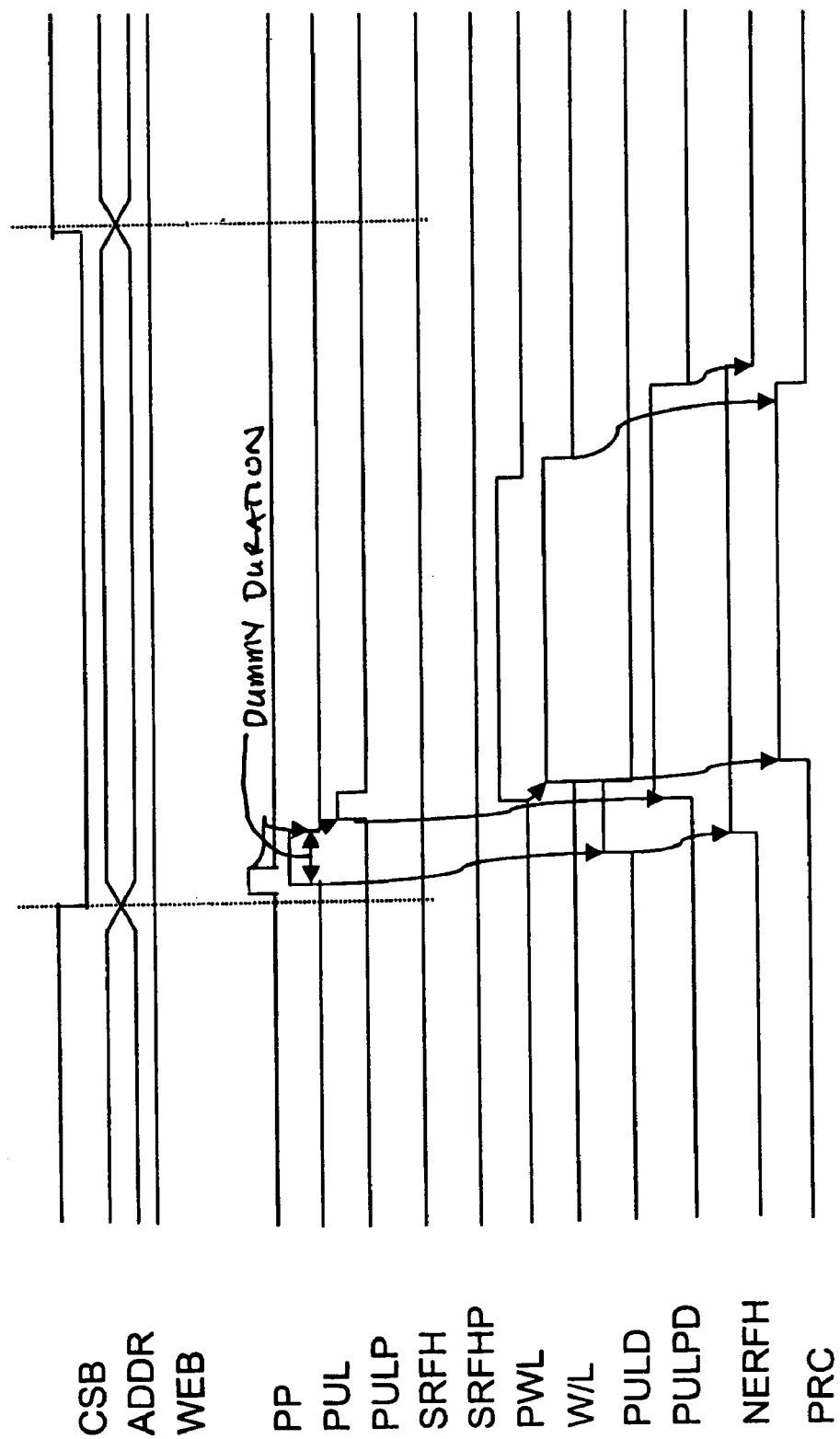
FIG. 7 is an operation timing diagram of the circuit in FIG. 6 in accordance with an exemplary embodiment of the invention.

FIG. 7 is a timing diagram illustrating the operation of FIG. 6 in accordance with an exemplary embodiment of the invention. FIG. 7 illustrates a case in which a read/write command is input to the memory device when no hidden refresh operation executing internally (i.e., there is no refresh pulse (SRFH)). FIG. 7 also illustrates a chip select signal (CSB) for selecting memory device operation, and a write enable signal (WEB). When a read/write address signal (addr) is input to address transition detector (ATD) 610 the and the PP pulse is output from ATD 610, a duration of the PP pulse may be extended by inverters 624, 626 and by NOR gate 628 of dummy duration part 612 which is shown in FIG. 7. An output of the NOR gate 628 may set the RS flip-flop 615, generating the delayed detection pulse PUL having a dummy duration pulse width (i.e., a first time) as shown in FIG. 7, for example. The PUL may be input to pulse generator 614 to generate the pulse signal PULP, as shown in FIG. 7. At about this time, the word line duration signal PWL may be generated by the word line duration circuit 622, as shown in FIG. 7, for example. Additionally at this time, an output of inverter 654 may be provided to word line enable period guarantee circuit 623 to generate the dummy duration guarantee pulse PRC, which is input to dummy duration part 612, to reset RS flip-flop 615 and cut off output of the PUL. In other words, the PRC may adjust the width of the PUL (dummy duration time) so as to be shorter than trc, as shown in FIG. 7.

Therefore, a dummy duration time generated by the word line enable timing determination circuit 600 may be about the same as the first pulse width of the PUL generated by the dummy duration part 612. Accordingly, in a case where a read/write cycle period may progress at a substantially high speed, such as processing speeds typically observed in non-volatile memory devices such as PSRAMs, DRAMs, etc., the dummy duration time may be of a duration that is shorter than a duration (or period) of a trc. Because the hidden refresh does not execute when the read or write command is input, a word line for the read write command can be enabled immediately after the delay of the shorter dummy duration time (after the dummy duration time has elapsed), instead of after a delay period equal to the trc, as in the prior art.

Figure 8:
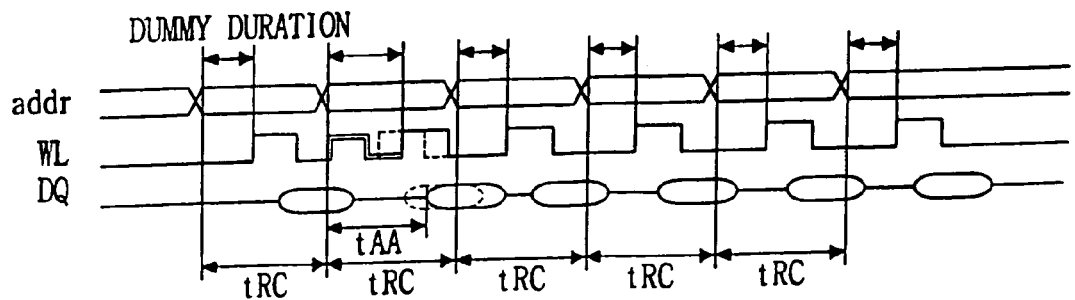
FIG. 8 is a refresh timing diagram at a minimum read cycle time of FIG. 6 in accordance with an exemplary embodiment of the invention.

FIG. 8 is a refresh timing diagram at a minimum read cycle time of FIG. 6 in accordance with an exemplary embodiment of the invention. In a prior art PSRAM, a tRC(read cycle time) becomes equal to an rAA(address access time), and as tRC=tAA, tRC equals twice the trc (2trc). However, according to the exemplary embodiments of the present invention, the above relation between tRC, trc and taa may be represented as 2tRC=3trc+taa. This indicates that a time period of the read cycle spans from an activation of a word line to an output of data. Therefore, a tRC may be enhanced by about "(trc-taa)/2" as shown in FIG. 8, as compared to the timing diagram of a dummy duration for a refresh operation in a prior art PSRAM of FIG. 1A.

Figure 9:
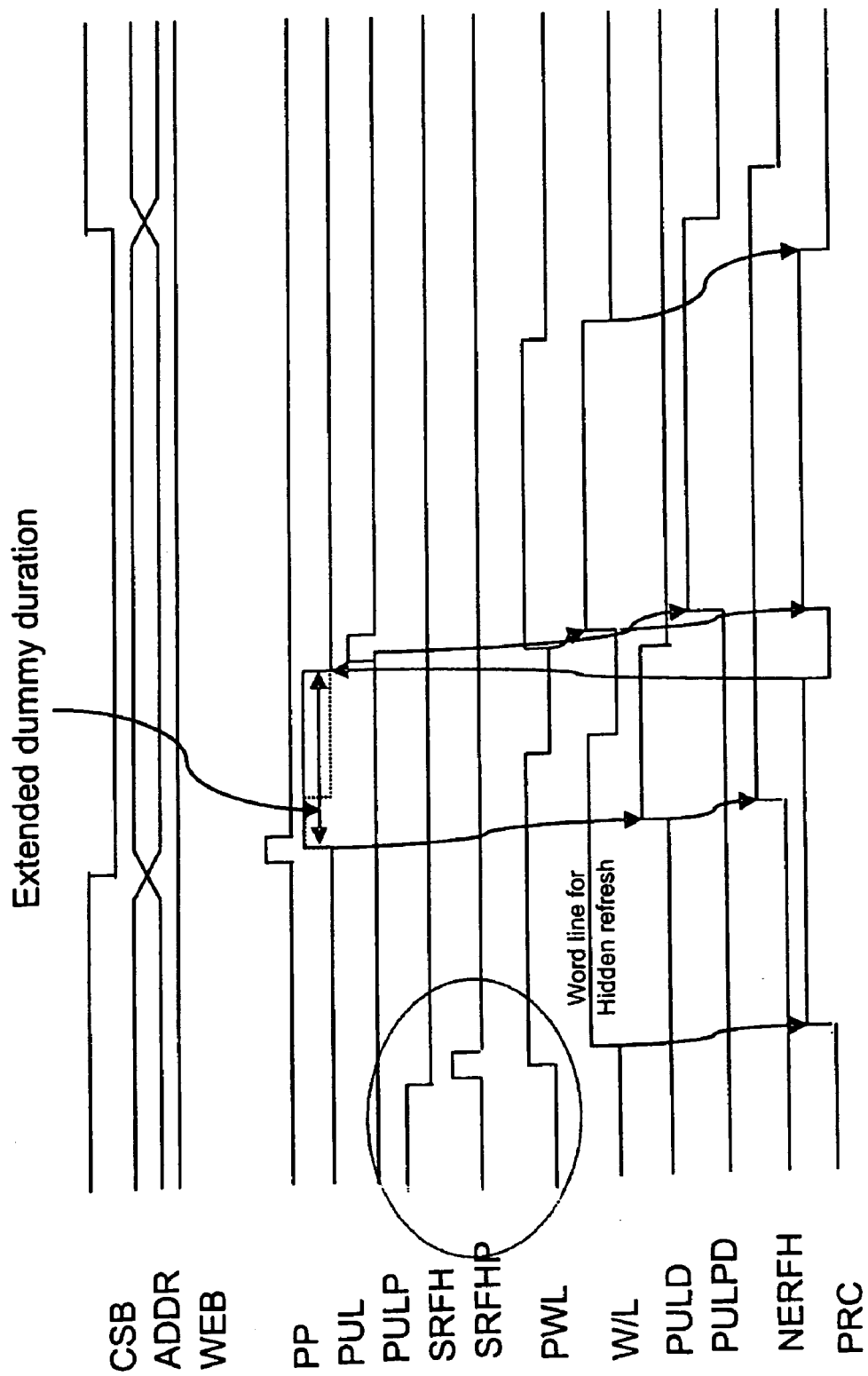
FIG. 9 is an operation timing diagram of the circuit in FIG. 6 in accordance with an exemplary embodiment of the invention.

FIG. 9 is an operation timing diagram of FIG. 6 in accordance with an exemplary embodiment of the invention. In addition to the other signals or pulse already described, FIG. 9 also illustrates a chip select signal (CSB) for selecting memory device operation and a write enable signal (WEB). FIG. 9 illustrates a timing that is sufficient enough to guarantee a dummy duration, when a hidden refresh operation is performed internally in the memory device. In other words, FIG. 9 shows a case where the read/write command is inputted to the memory device during internal execution of a hidden refresh. The internal hidden refresh may be shown by the pulses SRFH and SRFHP generated in the circle of FIG. 9, for example.

In order to guarantee a trc for word line enable by the hidden refresh operation, the enable timing of the word line for the read/write command should be delayed until the trc time passes. Accordingly, as shown in FIG. 9, the pulse width of the dummy duration guarantee pulse PRC is equal to or greater than the duration of a trc. When the PRC goes to low, the RS flip flop 621 in the dummy duration part 612 is reset, so that the delay detection pulse (PUL) is disabled (goes to low). This generates the pulse signal PULP in the pulse generator 614. Accordingly, a word line in response to an input read/write command is enabled (activated) by the PULP, as shown by the arrow between the transition to high of the PULP and the transition from disable to enable of the word line (WL) in FIG. 9.

Figure 10:
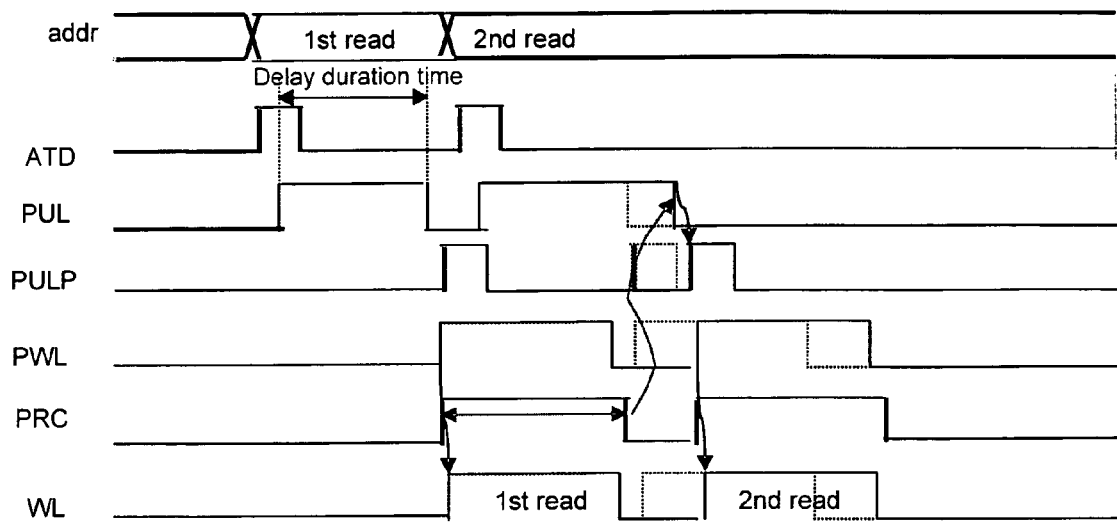
FIG. 10 is a timing diagram showing a skew free operation performed by the circuit of FIG. 6, in accordance with an exemplary embodiment of the invention.

FIG. 10 is a timing diagram showing a skew free operation for the circuit of FIG. 6, in accordance with an exemplary embodiment of the invention. As shown in FIG. 10, and without ignoring a preceding read/write, a second read/write (e.g., a second of two or more consecutive read/write commands) may be delayed sufficiently so as to guarantee a trc of the first read/write command. Thus, FIG. 10 illustrates a case where a consecutive read/write command is inputted to the memory device within a time duration smaller than the trc, but greater than the dummy duration, as shown in FIG. 10. To guarantee a trc for the word line enabled by the first read/write operation, enabling time of the word line for the second read/write command is delayed until the trc time duration has passed. When the PRC goes to a logic low, the PUL goes to a logic low and the PULP is generated. Thus, a word line for the second read/write command is enabled (activated) in response to the PULP, after guaranteeing a trc for the word line enabled by the first read/write command.

Figure 11A:
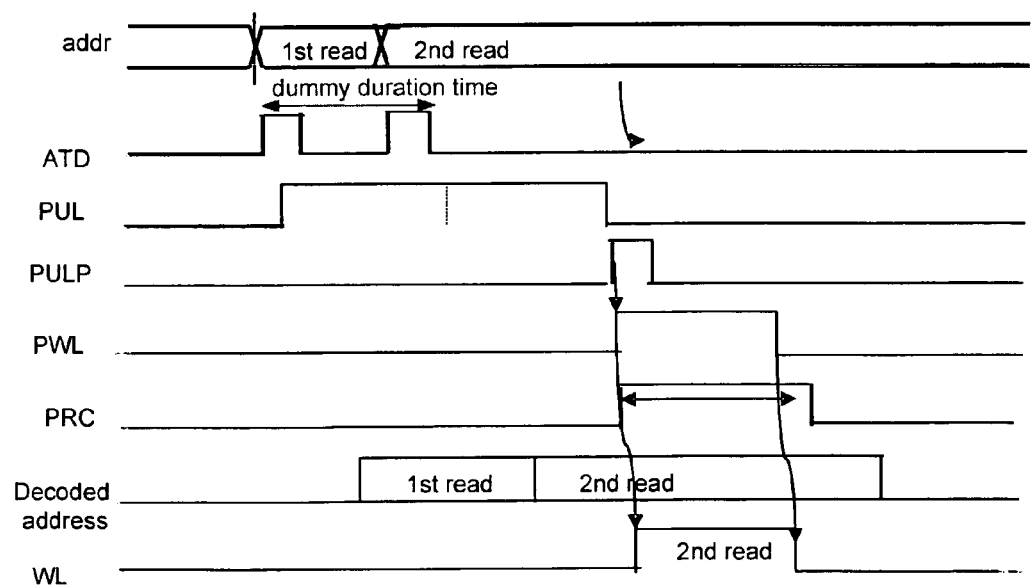
FIG. 11A is a timing drawing showing a skew free operation performed by the circuit of FIG. 6 in accordance with an exemplary embodiment of the invention.

FIG. 11A is a timing diagram showing a skew free operation for the circuit of FIG. 6 in accordance with another exemplary embodiment of the present invention. FIG. 11A illustrates a case in which a consecutive read/write command (first and second commands) are inputted into the memory device within the dummy duration time, which in FIG. 11A is the same duration as the first pulse width of the PUL. Because the PULP for the first read/write command cannot generate, the first read/write command is ignored in this situation.

Figure 11B:
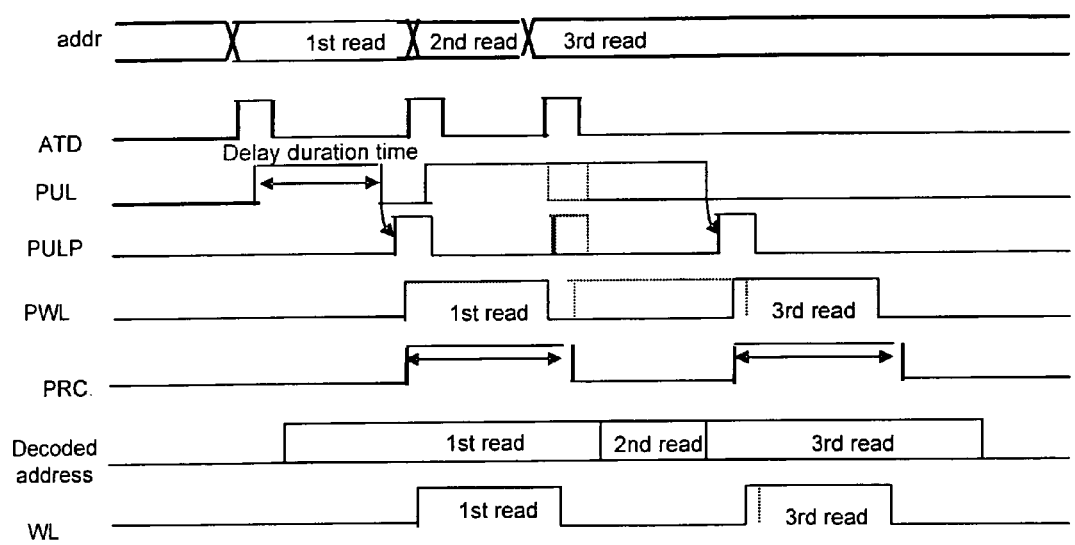
FIG. 11B is a timing drawing showing a skew free operation performed by the circuit of FIG. 6 in accordance with an exemplary embodiment of the invention.

FIG. 11B, is a timing drawing showing a skew free operation for the circuit of FIG. 6 in accordance with another exemplary embodiment of the invention. The timing diagram in FIG. 11B illustrates operations occurring when a third read/write command (the third of three consecutive read/write commands) is input to the memory device within a duration that is smaller than the dummy duration time for the second read/write command. Referring to FIG. 11B, the PULP for the second read/write command cannot generate because the PUL for the second read/write command is not able to disable. Accordingly, in this example of FIG. 11B, the second read/write command is ignored and word lines are activated only for the first and third read/write commands.

Accordingly, the exemplary embodiments of the present invention may provide a pseudo static random access memory (PSRAM) device having high-speed access capabilities, and which may be able to adaptively vary a dummy duration time for a refresh operation adaptively to a read/write cycle. Further, the exemplary embodiments of the present invention may shorten a read/write cycle time so as to access data at a substantially high speed. In a case where no refresh operation is performed internally in the memory device, this may be accomplished by reducing a dummy duration for a refresh operation. In a case where a refresh operation is executed internally, this may be accomplished by delaying or extending the dummy duration.

Although the exemplary embodiments of the present invention have been described in terms of a PSRAM, the present invention is not so limited. The exemplary embodiment s may be adapted to any non-volatile memory device, such as a DRAM, DDR RAM, VRAM, SDRAM, etc.

The exemplary embodiments of the present invention being thus described, it will be obvious that the same may be varied in many ways. Such variations are not to be regarded as a departure and scope of the exemplary embodiments of the present invention, and all such modifications as would be obvious to one skilled in the art are intended to be included within the scope of the following claims.

What is claimed is:

1. A word line enable timing determination circuit in a memory device adapted to perform a hidden refresh operation, comprising:
   a detector detecting an address signal and generating a detection pulse (PP) signal in response thereto;
   a first signal generator generating a delayed detection pulse signal (PUL) having a first pulse width;
   a second signal generator generating a pulse signal (PULP) based on the state of the PUL;
   a third signal generator generating a refresh cutting signal (NERFH) in response to a delayed version of at least one of the PUL and PULP;
   a fourth signal generator generating a refresh pulse signal (SRFHP) in response to an output from an internal refresh oscillator, and cutting off the SRFHP in response to the NERFH;
   a first circuit generating a word line duration signal (PWL) in response to the PULP and the SRFHP; and
   a second circuit for extending the first pulse width of the PUL to a second pulse width in response to the PWL.

2. The circuit of claim 1, wherein each of the first pulse width and second pulse width of the PUL represents a dummy duration time for activating a word line of a memory cell in the memory device, in response to a read/write command input thereto.

3. The circuit of claim 2, wherein
   when a read/write command is input to the memory device,
      a word line is enabled after the dummy duration time represented by the first pulse width of the PUL, if the memory device is not executing a hidden refresh operation therein, else
      a word line is enabled after the extended dummy duration time represented by the second pulse width of the PUL.

4. The circuit of claim 1, wherein the second signal generator generates the PULP if the PUL disables.

5. The circuit of claim 1, wherein the duration of time of the first pulse width is less than a row cycle time (trc) which guarantees that a read/write operation, in response to a read/write command input to the memory device, is executed.

6. The circuit of claim 1, wherein a duration of time by which the first pulse width of the PUL is extended to obtain the second pulse width exceeds the duration of a trc.

7. The circuit of claim 1, further comprising:
   a first delay circuit delaying the PUL received from the first signal generator to output a further delayed detection pulse (PULD); and
   a second delay circuit delaying the PULP received from the second signal generator to output a delayed pulse signal (PULPD),
   wherein the third signal generator generates the NERFH in response to the PULD and PULPD.

8. The circuit of claim 1, further comprising:
   an address decoder decoding the address signal to output a decoded address signal; and
   a row decoder activating a word line in response to the PWL and the decoded address.

9. The circuit of claim 8, wherein the row decoder activates the word line for executing a read/write command when each of the PWL and the decoded address signal are enabled.

10. A method of determining word line enable timing in a memory device adapted to perform a hidden refresh operation, comprising:
   when a read/write command is input to the memory device
   activating a word line for the read/write command after a first delay, if the memory device is not executing a hidden refresh operation, else
   activating a word line for the read/write command after a second delay.

11. The method of claim 10, wherein the duration of the second delay is greater than the first delay.

12. The method of claim 10, wherein the duration of the first delay is less than a row cycle time (trc) which guarantees that a read/write operation, in response to a read/write command input to the memory device, is executed.

13. The method of claim 10, wherein the duration of the second delay exceeds a trc.

14. The method of claim 10, wherein the first delay and second delay represents a dummy duration time for activating a word line of a memory cell in the device, in response to a read/write command input thereto.

15. A method of determining word line enable timing in a memory device, comprising:
   when consecutive first and second read/write commands are input to the memory device, and
   if the second read/write command is received by the memory device within a first time after receiving a first read/write command
   ignoring the first read/write command; and
   activating a word line for the second read/write command after the first time, else
   if receiving the second read/write command within a time duration that is greater than the first time but less than a duration of a row cycle time (trc) after receiving the first read/write command
   activating a word line for the first read/write command, and
   activating a word line for the second read/write command, after a second time has elapsed.

16. The method of claim 15, wherein the second time is greater than the first time.

17. The method of claim 15, wherein
   the trc represents a duration of time for guaranteeing that a read/write command is executed in the memory device, and
   the first time is less than the trc.

18. The method of claim 17, wherein
   the second time represents an extension of the first time by delaying the first time, and
   the duration by which the first time is extended exceeds the trc.

19. The method of claim 15, wherein
   the first time and second time represents a dummy duration time for activating a word line of a memory cell in the device, in response to the first and second read/write commands input thereto.

20. A method of determining word line enable timing in a memory device, comprising:
   when consecutive first, second and third read/write commands are input to the memory device,
   if the second read/write command is received by the memory device within a time duration that is greater than a first time but less than a duration of a row cycle time (trc) after receiving the first read/write command, and the third read/write command is received after receiving the second read/write command in a time duration that is less than or equal to the first time,
   activating a word line for the first read/write command, ignoring the second read/write command, and activating a word line for the third read/write command.

21. A method of determining word line enable timing in a memory device, comprising:
adjusting enable timing at which to activate a word line for a memory cell of the memory device in response to at least one read/write command input to the memory device based on whether the device is performing a hidden refresh operation.

22. The method of claim 21, wherein the enable timing includes a dummy duration time that, upon receipt of the at least one read/write command, elapses before the word line is activated.

23. The method of claim 22,
wherein the word line for the at least one read/write command is activated immediately after the dummy duration has elapsed, if the memory device is not executing a hidden refresh operation, else
said adjusting further includes extending the dummy duration time, with the word line being activated after the extended dummy duration time has elapsed.

24. The method of claim 23, wherein
the dummy duration is less than a row cycle time (trc) which guarantees that a read/write operation in response to the at least one read/write command is executed, and
the duration of the extended dummy duration exceeds the trc.

25. A word line enable timing determination circuit of a memory device configured to determine word line enable timing in accordance with the method of claim 10.

26. A word line enable timing determination circuit of a memory device configured to determine word line enable timing in accordance with the method of claim 15.

27. A word line enable timing determination circuit of a memory device configured to determine word line enable timing in accordance with the method of claim 20.

28. A word line enable timing determination circuit of a memory device configured to determine word line enable timing in accordance with the method of claim 21.

* * * * *